United States Patent
Kim et al.

(10) Patent No.: US 12,431,170 B2
(45) Date of Patent: Sep. 30, 2025

(54) MEMORY SYSTEM PERFORMING PERFORMANCE ADJUSTING OPERATION

(71) Applicant: Samsung Electronics Co., Ltd., Suwon-si (KR)

(72) Inventors: Duksoo Kim, Seoul (KR); Daesung Cheon, Hwaseong-si (KR); Doil Kong, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 26 days.

(21) Appl. No.: 17/858,374

(22) Filed: Jul. 6, 2022

(65) Prior Publication Data
US 2023/0063640 A1  Mar. 2, 2023

(30) Foreign Application Priority Data
Aug. 27, 2021 (KR) .................. 10-2021-0114252

(51) Int. Cl.
G11C 7/00 (2006.01)
G11C 7/04 (2006.01)
G11C 7/10 (2006.01)
G11C 7/22 (2006.01)

(52) U.S. Cl.
CPC .............. *G11C 7/04* (2013.01); *G11C 7/1084* (2013.01); *G11C 7/109* (2013.01); *G11C 7/227* (2013.01)

(58) Field of Classification Search
CPC ......... G11C 7/04; G11C 7/1084; G11C 7/109; G06F 3/0619; G06F 3/0653; G06F 3/0688; G06F 3/0659
See application file for complete search history.

(56) References Cited

U.S. PATENT DOCUMENTS

| 9,135,165 | B2 | 9/2015 | Terada |
| 9,142,277 | B2 | 9/2015 | Kim et al. |
| 9,152,568 | B1 | 10/2015 | Seigler et al. |
| 9,811,267 | B1 * | 11/2017 | Yang ............ G11C 16/26 |
| 9,894,805 | B2 | 2/2018 | Kim et al. |
| 10,120,593 | B2 | 11/2018 | Byun et al. |
| 10,365,854 | B1 | 7/2019 | Muchherla et al. |

(Continued)

FOREIGN PATENT DOCUMENTS

| KR | 10-2016-0137180 A | 11/2016 |
| KR | 10-2017-0042025 A | 4/2017 |

(Continued)

OTHER PUBLICATIONS

KR Notice of Allowance for corresponding Korean Patent Application No. 10-2021-0114252 issued on Jul. 7, 2022.

(Continued)

*Primary Examiner* — Uyen Smet
(74) *Attorney, Agent, or Firm* — Harness, Dickey & Pierce, P.L.C.

(57) ABSTRACT

A memory system includes a substrate, a first memory package mounted on the substrate and including a plurality of first non-volatile memories (NVMs), a second memory package mounted on the substrate and including a plurality of second NVMs, and a memory controller configured to increase performance of at least one of the plurality of first NVMs and lower performance of at least one of the plurality of second NVMs, based on a temperature of the substrate.

20 Claims, 14 Drawing Sheets

(56) References Cited

U.S. PATENT DOCUMENTS

| | | | |
|---|---|---|---|
| 10,423,360 B2 | 9/2019 | Kim et al. | |
| 2013/0275650 A1 | 10/2013 | Hida et al. | |
| 2015/0301744 A1* | 10/2015 | Kim | G06F 3/0659 |
| | | | 711/103 |
| 2016/0011779 A1* | 1/2016 | Lee | G11C 16/08 |
| | | | 711/103 |
| 2016/0334992 A1 | 11/2016 | Yashiro | |
| 2017/0038805 A1* | 2/2017 | Chun | G11C 7/04 |
| 2018/0246674 A1* | 8/2018 | Kim | G06F 3/0679 |
| 2019/0018611 A1 | 1/2019 | Kim | |
| 2019/0339755 A1 | 11/2019 | Chai | |
| 2020/0279588 A1* | 9/2020 | Lym | G11C 29/021 |
| 2020/0394114 A1 | 12/2020 | Lee et al. | |
| 2021/0343318 A1* | 11/2021 | Shallal | G11C 7/1045 |
| 2022/0028826 A1* | 1/2022 | Arifeen | H01L 23/3677 |

FOREIGN PATENT DOCUMENTS

| | | |
|---|---|---|
| KR | 10-2018-0099266 A | 9/2018 |
| KR | 10-2019-0011654 A | 2/2019 |
| KR | 10-1962784 B1 | 3/2019 |
| KR | 10-2019-0127173 A | 11/2019 |

OTHER PUBLICATIONS

EP Extended European Search report for corresponding Patent Application No. 22188273.1 issued on Jan. 23, 2023.

\* cited by examiner

MEMORY SYSTEM PERFORMING PERFORMANCE ADJUSTING OPERATION

CROSS-REFERENCE TO RELATED APPLICATION

This U.S. non-provisional application is based on and claims the benefit of priority under 35 U.S.C. § 119 to Korean Patent Application No. 10-2021-0114252, filed on Aug. 27, 2021, in the Korean Intellectual Property Office, the disclosure of which is incorporated by reference herein in its entirety.

BACKGROUND

Various example embodiments of the inventive concepts relate to a memory system, a memory device, and/or a method of operating the memory system, and more particularly, to a memory controller performing a performance adjusting operation and a memory system including the same.

Data storage devices, such as solid state drives (SSDs), which may quickly input/output high-capacity data are in increasing demand SSDs include a memory controller and a number of memory packages therein, and device damage and performance limitations due to heat generation are problematic. Therefore, research on methods for reducing the amount of heat generated by the SSD are actively being conducted.

SUMMARY

Various example embodiments of the inventive concepts provide a memory controller for reducing and/or preventing a SSD from reaching a high temperature through a performance adjusting operation before a performance throttling operation due to a high temperature start, a memory system including the same, and/or method for operating the memory system, etc.

According to at least one example embodiment of the inventive concepts, there is provided a memory system including a substrate, a first memory package mounted on the substrate and including a plurality of first non-volatile memories (NVMs), a second memory package mounted on the substrate and including a plurality of second NVMs, and a memory controller configured to increase performance of at least one of the plurality of first NVMs and lower performance of at least one of the plurality of second NVMs based on a temperature of the substrate.

According to at least one example embodiment of the inventive concepts, there is provided a memory system including a first memory package including a plurality of first non-volatile memories (NVMs), a second memory package including a plurality of second NVMs, a temperature sensor configured to detect a temperature of the second memory package, and a memory controller configured to, in response to the detected temperature reaching a first temperature threshold level, control the plurality of first NVMs to increase a first temperature increase rate of the first memory package and control the plurality of second NVMs to decrease a second temperature increase rate of the second memory package.

According to at least one example embodiment of the inventive concepts, there is provided an operating method of a memory controller, the memory controller including a first memory package and a second memory package, each of the first memory package and the second memory package including a plurality of memory devices, and mounted on a substrate, the method including acquiring a temperature of the substrate from a temperature sensor, increasing a performance level of the first memory package in response to the temperature of the substrate exceeding a first reference temperature threshold level, decreasing a performance level of the second memory package in response to the temperature of the substrate exceeding the first temperature threshold level, and decreasing the performance level of the first memory package and the second memory package in response to the temperature of the substrate exceeding a second temperature threshold level greater than the first temperature threshold level.

BRIEF DESCRIPTION OF THE DRAWINGS

Various example embodiments of the inventive concepts will be more clearly understood from the following detailed description taken in conjunction with the accompanying drawings in which.

DETAILED DESCRIPTION

Hereinafter, various example embodiments of the inventive concepts are described with reference to the accompanying drawings.

Figure 1:
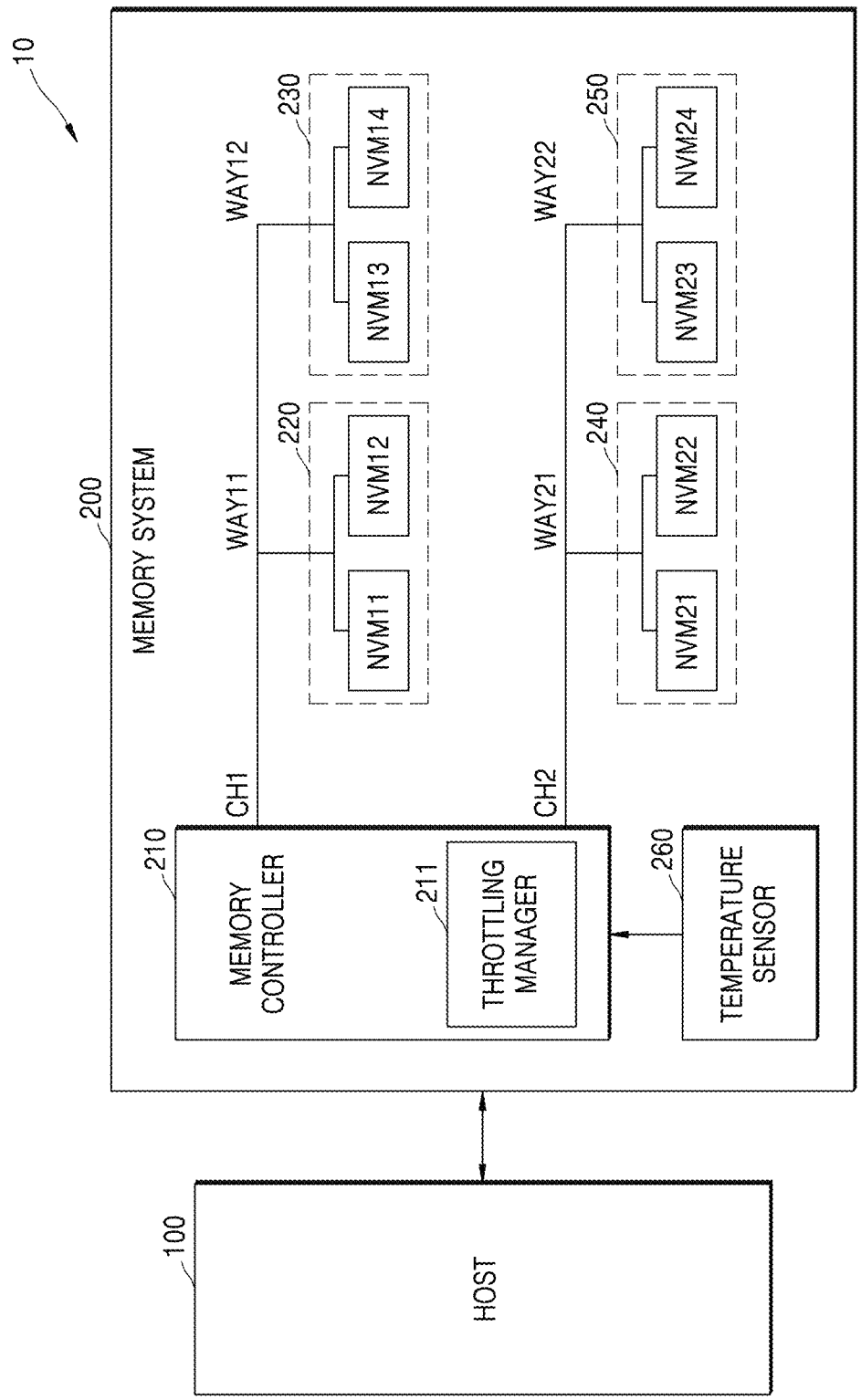
FIG. 1 is a block diagram illustrating a data processing system according to at least one example embodiment of the inventive concepts.

FIG. 1 is a block diagram illustrating a data processing system 10 according to at least one example embodiment of the inventive concepts.

Referring to FIG. 1, the data processing system 10 may include at least one host 100 (e.g., a host device, etc.) and/or a memory system 200, etc., but the example embodiments are not limited thereto, and for example, the data processing system 10 may include a greater or lesser number of constituent elements. The data processing system 10 may be a fixed computing system, such as desktop PCs, servers, etc., or may correspond to laptop computers, mobile phones, smartphones, tablet PCs, personal digital assistants (PDAs), enterprise digital assistants (EDAs), digital still cameras, digital video cameras, portable multimedia players (PMPs), personal navigation devices or portable navigation devices (PDNs), handheld game consoles, mobile internet devices (MIDs), wearable computers, internet of things (IoT) devices, internet of everything (IoE) devices, and/or an e-book, etc., but is not limited thereto.

The host 100 may control the memory system 200 and may be referred to as a host processor, a host device, or the like. In some example embodiments, the host 100 may execute a series of instructions (e.g., computer readable instructions, computer executable instructions, etc.) and/or at least one program including instructions, etc. A program may include a plurality of subprograms, and a subprogram may be referred to as a subroutine, a routine, a procedure, a function, or the like. In some example embodiments, the host 100 may include at least one intellectual property (IP) core and/or at least one field programmable gate array (FPGA) designed by logic synthesis, etc., but is not limited thereto. The host 100 may include an application processor (AP) in the form of a system on chip (SoC) mounted in mobile devices or the like, and/or may include a central processing unit (CPU) included in computer systems, etc.

The memory system 200 may include a plurality of non-volatile memories (NVMs), e.g., NVM11 to NVM14 and NVM21 to NVM24, etc., and may include, for example, read only memory (ROM), magnetic disk, optical disk, and/or flash memory, but is not limited thereto. The flash memory may be a memory storing data according to a change in a threshold voltage of a MOS transistor, and may include NAND flash and/or NOR flash, etc. In some example embodiments, the memory system 200 may be implemented as a memory card including an NVM system, such as embedded multi-media controller (eMMC), secure digital (SD), micro SD, universal flash storage (UFS), and/or a solid state drive (SSD), etc. However, the example embodiments are not limited thereto, and the memory system 200 may include a volatile memory device, etc., and the description of an NVM below may also be applied to a volatile memory device.

The memory system 200 may include at least a memory controller 210, first to fourth memory packages 220 to 250, and/or a temperature sensor 260, etc., but the example embodiments are not limited thereto, and for example, a greater or lesser number of memory controllers, memory packages, and/or temperature sensors, etc., may be included in the memory system 200.

Each of the first to fourth memory packages 220 to 250 may include a plurality of NVMs. For example, the first memory package 220 may include first and second NVMs NVM11 and NVM12, the second memory package 230 may include third and fourth NVMs NVM13 and NVM14, the third memory package 240 may include fifth and sixth NVMs NVM21 and NVM22, and the fourth memory package 250 may include seventh and eighth NVMs NVM23 and NVM24, etc.

Each of the memory devices NVM11 to NVM14 and NVM21 to NVM24 may include a memory cell array capable of preserving stored data even when power is cut off, e.g., there is no power provided to the memory devices, etc. The memory cell array may include a plurality of memory cells. The memory cell array may include NAND or NOR flash memory, magnetic random access memory (MRAM), resistance RAM (RRAM), ferroelectric RAM (FRAM), and/or phase change memory (PCM), but is not limited thereto. As an example, when the memory cell array includes NAND flash memory, the memory cell array may include a plurality of blocks and pages, and data programming and reading are performed in units of pages, whereas data erasure may be performed in units of blocks, but the example embodiments are not limited thereto.

The memory controller 210 may receive at least one command for a memory operation from the host 100, generate an internal command using the received command, and/or provide the internal command to the first to fourth memory packages 220 to 250, etc.

The memory controller 210 may be connected to the first to eighth NVMs NVM11 to NVM14 and NVM21 to NVM24 through first and second channels CH1 and CH2, but the example embodiments are not limited thereto. Each channel may correspond to a plurality of ways (e.g., first to fourth ways) representing a logical path. For example, the first channel CH1 may correspond to first and second ways WAY11 and WAY12, and the second channel CH2 may correspond to third and fourth ways WAY21 and WAY22, etc. However, the example embodiments are not limited thereto, and the memory controller 210 may be connected to three or more channels, and each channel may correspond to a plurality of ways, etc. A channel may be a physical interface unit capable of independently writing data. Accordingly, a write operation for channels may be performed in parallel (e.g., in an overlapping manner, simultaneous manner, and/or synchronous manner, etc.). Each way may correspond to one or more NVMs sharing one channel That is, two or more NVMs may correspond to one way. According to some example embodiments, a write operation for two or more NVMs corresponding to one channel may be performed in an interleaving manner, etc. The write operation performed in parallel and the write operation performed in an interleaving manner are described in detail below with reference to FIG. 2.

The memory controller 210 may include a throttling manager 211. The throttling manager 211 may be implemented as hardware or a combination of hardware and software. The throttling manager 211 may perform a performance adjusting operation to adjust the performance of the NVMs NVM11 to NVM14 and NVM21 to NVM24, based on a temperature provided from the temperature sensor 260. In at least one example embodiment, the throttling manager 211 may initiate the performance adjusting operation when the temperature provided from the temperature sensor 260 exceeds a first reference level (e.g., a first temperature threshold level, etc.). In some example embodiments, the temperature sensor 260 may detect a temperature of a substrate (not shown) on which the first to fourth memory packages 220 to 250 are mounted. The temperature sensor 260 may initiate the performance adjusting operation when the temperature of the substrate exceeds the first reference level. In some example embodiments, the temperature sensor 260 may detect the temperature of each of the memory devices, e.g., each of the first to fourth memory packages 220 to 250, etc. The temperature sensor 260 may provide a temperature of a memory package having the highest temperature among the first to fourth memory packages 220 to 250, to the throttling manager 211, but is not limited thereto.

When the temperature provided from the temperature sensor 260 exceeds the first reference level (e.g., first temperature threshold level, etc.), the throttling manager 211 may lower the performance of an NVM included in a memory package having a relatively high temperature (e.g., throttle the performance of the NVM(s) included in the memory package and/or memory device corresponding to a detected temperature exceeding the first reference level), and may increase the performance of an NVM included in a memory package having a relatively low temperature (e.g., increase the performance of the NVM(s) included in a memory package corresponding to a detected temperature which has not exceeded the first reference level), etc.

When the temperature provided from the temperature sensor 260 exceeds a second reference level (e.g., a second temperature threshold level), the throttling manager 211 may decrease the performance of an NVM included in a memory package having a relatively high temperature and decrease the performance of an NVM included in a memory package having a relatively low temperature, thereby performing a throttling operation. During the throttling operation, an overall performance of the memory system 200 may be lowered.

The throttling manager 211 according to at least one example embodiment of the inventive concepts may perform both the operation of lowering the performance of the NVM included in the memory package having a high temperature and the operation of increasing the performance of the NVM included in the memory package having a low temperature according to whether the temperature provided from the temperature sensor 260 exceeds the first reference level that is lower than the second reference level as a reference of the throttling operation. Accordingly, a phenomenon in which the temperature of the substrate is excessively increased may be reduced and/or prevented, so that the throttling operation may not start and/or is not performed, and the overall performance of the memory system 200 may be maintained.

In some example embodiments, the memory system 200 may further include a heat sink (not shown) for lowering the temperature of the memory system 200. For example, the heat sink may be detachably attached to the first surface of the substrate (not shown) on which the first to fourth memory packages 220 to 250 are mounted, but is not limited thereto. The degree to which the temperature and/or heat of the first to fourth memory packages 220 to 250 are dissipated by the heat sink may be different according to a distance from the heat sink. For example, the first and second memory packages 220 and 230 may be mounted on the first surface of the substrate to which the heat sink is attached, and the third and fourth memory packages 240 and 250 may be mounted on a second surface to which the heat sink is not attached. Accordingly, the degree to which the temperature and/or heat of the first and second memory packages 220 and 230 are dissipated by the heat sink may be greater than the degree to which the third and fourth memory packages 240 and 250 are dissipated by the heat sink, etc. Consequently, the throttling manager 211 may increase the performance of an NVM included in the package(s) relatively close to the heat sink, and lower the performance of an NVM included in the package(s) relatively distant from the heat sink during the performance adjusting operation, etc. Because both the operation of increasing the performance of the NVM included in the package(s) relatively close to the heat sink and the operation of lowering the performance of the NVM included in the package(s) relatively distant from the heat sink are performed, a phenomenon in which a temperature of the memory system 200 is excessively and/or undesirably increased may be reduced and/or prevented, and thus, the throttling operation may not be performed and/or start, and the overall performance of the memory system 200 may be maintained, etc.

The temperature sensor 260 may measure the temperature of the memory system 200 and provide the measured temperature to the memory controller 210. In some example embodiments, the temperature sensor 260 may measure a temperature of each of the plurality of memory packages, e.g., first to fourth memory packages 220 to 250, etc., and provide the measured temperatures to the memory controller 210. In some example embodiments, the temperature sensor 260 may measure a temperature of each of the first to eighth NVMs NVM11 to NVM14 and NVM21 to NVM24 and provide the measured temperatures to the memory controller 210. In some example embodiments, the temperature sensor 260 may measure a temperature of the substrate on which the first to fourth memory packages 220 to 250 are mounted, and provide the measured temperatures to the memory controller 210.

Figure 2:
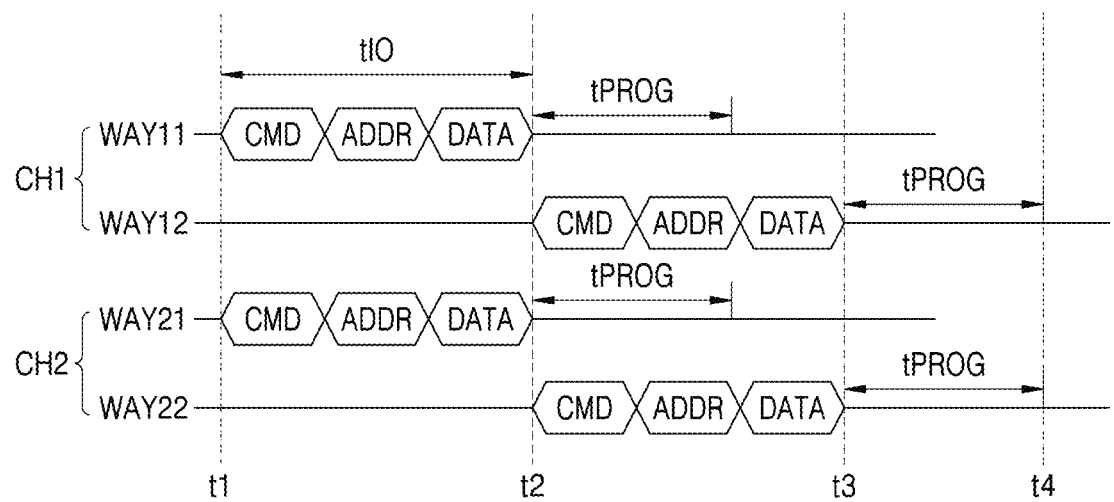
FIG. 2 is a view illustrating a parallel write operation and a write operation according to an interleaving method according to at least one example embodiment of the inventive concepts.

FIG. 2 is a view illustrating a parallel write operation and a write operation according to an interleaving method according to at least one example embodiment of the inventive concepts. FIG. 2 may be described below with reference to FIG. 1, but the example embodiments are not limited thereto.

The memory controller 210 may transfer a command CMD, an address ADDR, and/or data DATA, etc., to the NVM to perform a write operation on at least one NVM.

An operation in which the memory controller 210 provides the command CMD, the address ADDR, and the data DATA to the NVM may be referred to as an input/output (I/O) operation. Because the first and second channels CH1 and CH2 may be formed through separate wirings, the I/O operations for the first and second channels CH1 and CH2 may be performed in parallel, but the example embodiments are not limited thereto. That is, the I/O operations for the first and second channels CH1 and CH2 may be simultaneously performed from a first time point t1 to a second time point t2 and/or during the same clock cycle, etc. A time for which the command CMD, the address ADDR, and the data DATA are provided may be referred to as an I/O time tIO.

Because a plurality of ways corresponding to one channel share one channel, I/O operations for the ways may be performed in an interleaving manner, but are not limited thereto. For example, because the first and second ways WAY11 and WAY12 may share the first channel CH1, I/O operations for the first and second ways WAY11 and WAY12 may be performed in the interleaving manner That is, the I/O operation for the first way WAY11 may be performed from the first time point t1 to the second time point t2, and the I/O operation for the second way WAY12 may be performed from the second time point t2 to a third time point t3, etc.

After the I/O operation is performed, an internal write operation for the NVM corresponding to each way may be performed. The internal write operation may be performed during a write time tPROG. The write time tPROG may refer to a time desired and/or required for the NVM to store data in the memory cell array. Although it is illustrated that the input/output time tIO is longer than the write time tPROG, this is for convenience of description, and the example embodiments are not limited thereto.

Because the first and second NVMs NVM11 and NVM12 correspond to the first way WAY11, the first and second NVMs NVM11 and NVM12 may be provided with the same command CMD, address ADDR, and data are based on the I/O operation for the first way WAY11. The first and second NVMs NVM11 and NVM12 may be enabled based on a chip enable signal (not shown). The enabled first and second NVMs NVM11 and NVM12 may perform an internal write operation based on the command CMD, the address ADDR, and the data DATA received through the I/O operation, etc.

In some example embodiments, during the performance adjusting operation, the throttling manager 211 may increase the number of enabled NVMs included in a memory package having a relatively low temperature and may decrease the number of enabled NVMs included in a memory package having a relatively high temperature. Accordingly, both the effect of lowering the overall temperature of the memory system 200 and the effect of maintaining the overall performance of the memory system 200 may be provided. Details of the chip enable signal are described below with reference to FIGS. 8 and 9.

FIG. 2 shows that the write operation for the first to fourth ways WAY11 to WAY22 is performed once, and the write operation for the first to fourth ways WAY11 to WAY22 may be completed at a fourth time point t4 that elapses at a time corresponding to the sum of a double of the input/output time tIO and the write time tPROG, but the example embodiments are not limited thereto.

In some example embodiments, the throttling manager 211 may adjust the number of commands (e.g., memory-related commands, I/O commands, read commands, write commands, etc.) transferred to the memory package during the performance adjusting operation. In at least one example embodiment, the throttling manager 211 may adjust the number of commands transferred to the memory package based on a distance between the heat sink and the memory package. For example, the throttling manager 211 may reduce the number of commands transferred to a memory package relatively distant from the heat sink and/or increase the number of commands transferred to a memory package relatively close to the heat sink, etc. Accordingly, the start of the throttling operation may be delayed and/or avoided while the overall performance of the memory system 200 is maintained. Details of the adjustment of the number of commands are described below with reference to FIGS. 10 and 11.

In some example embodiments, the throttling manager 211 may adjust a length of a dummy time between the command CMD, the address ADDR, and/or the data DATA during the performance adjusting operation. Although not shown in FIG. 2, the dummy time may be set between the command CMD, the address ADDR, and/or the data DATA, etc., but is not limited thereto. During the dummy time, a channel may be occupied by dummy data, or may remain idle. The throttling manager 211 may adjust the length of the dummy time for individual memory packages based on a distance between the heat sink and the memory package. For example, the throttling manager 211 may increase the length of the dummy time between the command CMD, the address ADDR, and/or the data DATA transferred to a memory package relatively distant from the heat sink, and decreases the length of the dummy time between the command CMD, the address ADDR, and/or the data DATA transferred to a memory package relatively close to the memory package, etc. Accordingly, the start of the throttling operation may be delayed by using dummy times of different lengths, while the overall performance of the memory system 200 is maintained. Details of the dummy time are described below with reference to FIGS. 12 and 13.

Figure 3:
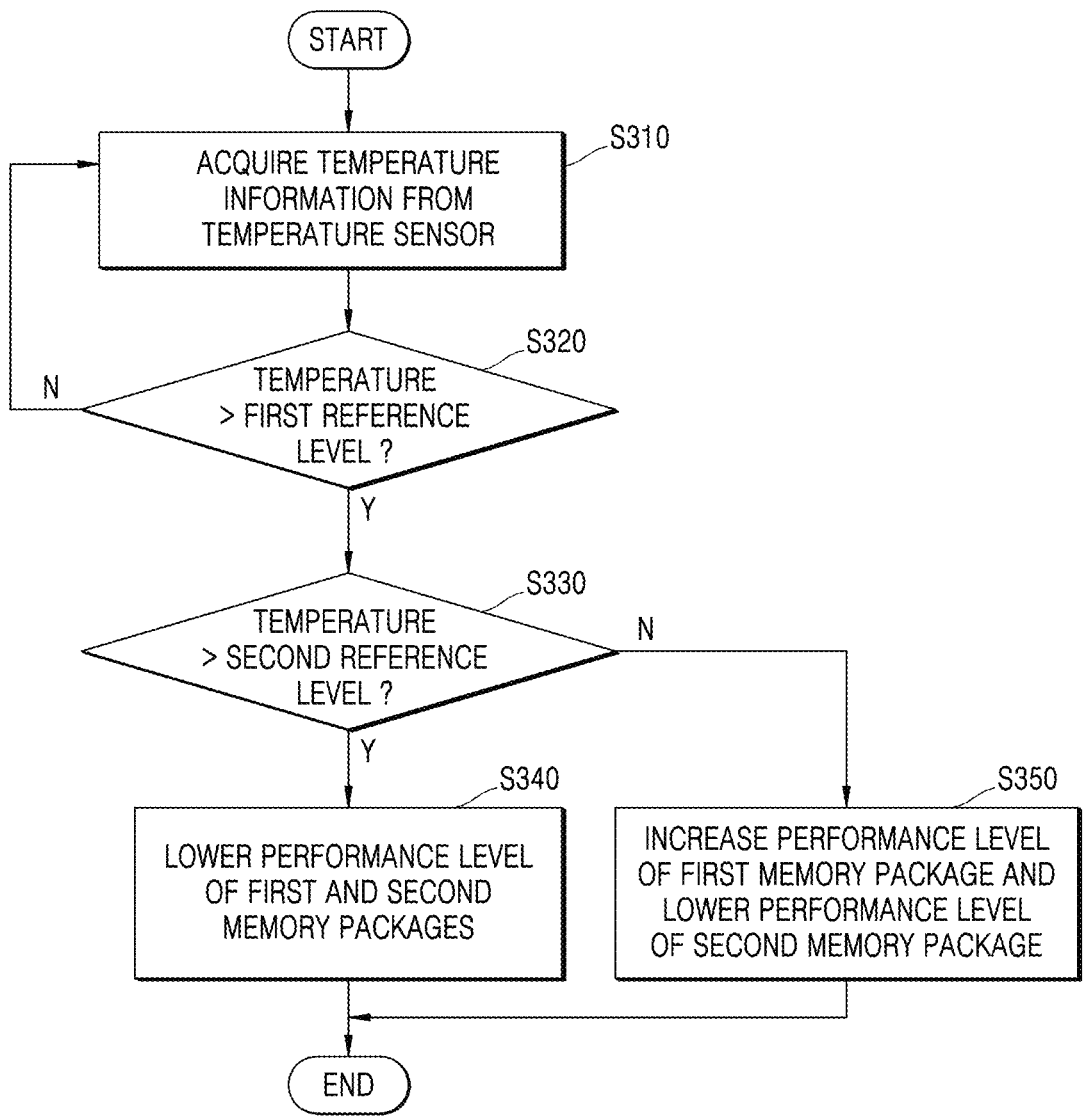
FIG. 3 is a flowchart illustrating an operating method of a memory controller, according to at least one example embodiment of the inventive concepts.

FIG. 3 is a flowchart illustrating an operating method of the memory controller 210 according to at least one example embodiment of the inventive concepts. FIG. 3 may be described below with reference to FIG. 1.

Referring to FIG. 3, the operating method of the memory controller 210 may include a plurality of operations S310 to S350, but the example embodiments are not limited thereto.

In operation S310, the memory controller 210 may acquire temperature information of the memory system 200 from the temperature sensor 260. The memory controller 210 may acquire the temperature information periodically and/or aperiodically, (e.g., at desired times, in response to temperature information requests, etc.). In some example embodiments, the temperature information of the memory system 200 may be temperature information of the substrate (not shown) on which the first to fourth memory packages 220 to 250 are mounted. In some example embodiments, the temperature information may be temperature information of each of the first to fourth memory packages 220 to 250, but is not limited thereto, and for example, may include temperature information of one or more of the plurality of memory packages.

In operation S320, the memory controller 210 may compare the temperature information acquired from the temperature sensor 260 with the first reference level (e.g., first temperature threshold level, etc.). If the temperature of the memory system 200 exceeds the first reference level, the memory controller 210 may perform operation S330, and if the temperature of the memory system 200 does not exceed the first reference level, the memory controller 210 performs operation S310 again.

In operation S330, the memory controller 210 may compare the temperature information obtained from the temperature sensor 260 with the second reference level (e.g., the second temperature threshold level, etc.). In operation S330, if the temperature of the memory system 200 exceeds the second reference level, the memory controller 210 may perform operation S340, and if the temperature of the memory system 200 does not exceed the second reference level, the memory controller 210 may perform operation S350.

Although operations S320 and S330 are described as being performed by the memory controller 210, operations S320 and S330 may also be performed by the temperature sensor 260, etc., but the example embodiments are not limited thereto.

In operations S340 and S350, the memory controller 210 may adjust the performance of the plurality of memory packages, e.g., first to fourth memory packages 220 to 250, but for the convenience of description and clarity purposes, only the first and second memory packages 220 and 230 are shown in FIG. 3 and described herein. That is, descriptions of the first and second memory packages 220 and 230 below may be applied to the other memory packages included in the memory system 200. For example, it may be assumed that the heat dissipation efficiency of the first memory package 220 is higher than that of the second memory package 230. Additionally and/or alternatively, it may be assumed that a distance between the first memory package 220 and the heat sink is shorter than a distance between the second memory package 230 and the heat sink.

In operation S340, the memory controller 210 may perform a throttling operation by lowering, reducing, and/or decreasing the performance levels of the first and/or second memory packages 220 and 230, etc. Each of the first and second memory packages 220 and 230 may include at least one NVM. In some example embodiments, the memory controller 210 may lower the performance levels of the first and/or second memory packages 220 and 230 by enabling a smaller number of NVMs (e.g., enabling/turning on a reduced number of NVMs in comparison to the number of NVMs enabled during a normal performance level/operation, etc.). In some example embodiments, the memory controller 210 may lower the performance levels of the first and/or second memory packages 220 and 230 by providing a smaller number of commands CMD to the NVMs. In some example embodiments, the memory controller 210 may lower the performance levels of the first and/or second memory packages 220 and 230 by increasing the length of the dummy time between the command CMD, the address ADDR, and/or the data DATA, etc.

In operation S350, the memory controller 210 may increase the performance level of the first memory package 220 and may perform the performance adjusting operation by lowering the performance level of the second memory package 230, but the example embodiments are not limited thereto. In some example embodiments, the first memory package 220 may be a memory package having a relatively high heat dissipation efficiency, and the second memory package 230 may be a memory package having a relatively low heat dissipation efficiency, but the example embodiments are not limited thereto. In some example embodiments, the first memory package 220 may be a memory package relatively close to the heat sink, and the second memory package 230 may be a memory package relatively far from the heat sink, but the example embodiments are not limited thereto. In some example embodiments, the memory controller 210 may increase the performance level of the first memory package 220 by enabling a greater number of NVMs in comparison to the number of NVMs enabled during a normal performance level, and lower the performance level of the second memory package 230 by enabling a smaller number of NVMs in comparison to the number of NVMs enabled during a normal performance level, etc. In some example embodiments, the memory controller 210 may increase the performance level of the first memory package 220 by providing a larger number of commands CMD to the NVMs, and may lower the performance level of the second memory package 230 by providing a smaller number of commands CMD to the NVMs, but the example embodiments are not limited thereto. In some example embodiments, the memory controller 210 may increase the performance level of the first memory package 220 by decreasing the length of the dummy time between the command CMD, the address ADDR, and/or the data DATA, etc., and may lower the performance level of the second memory package 230 by increasing the length of the dummy time, etc.

Figure 4:
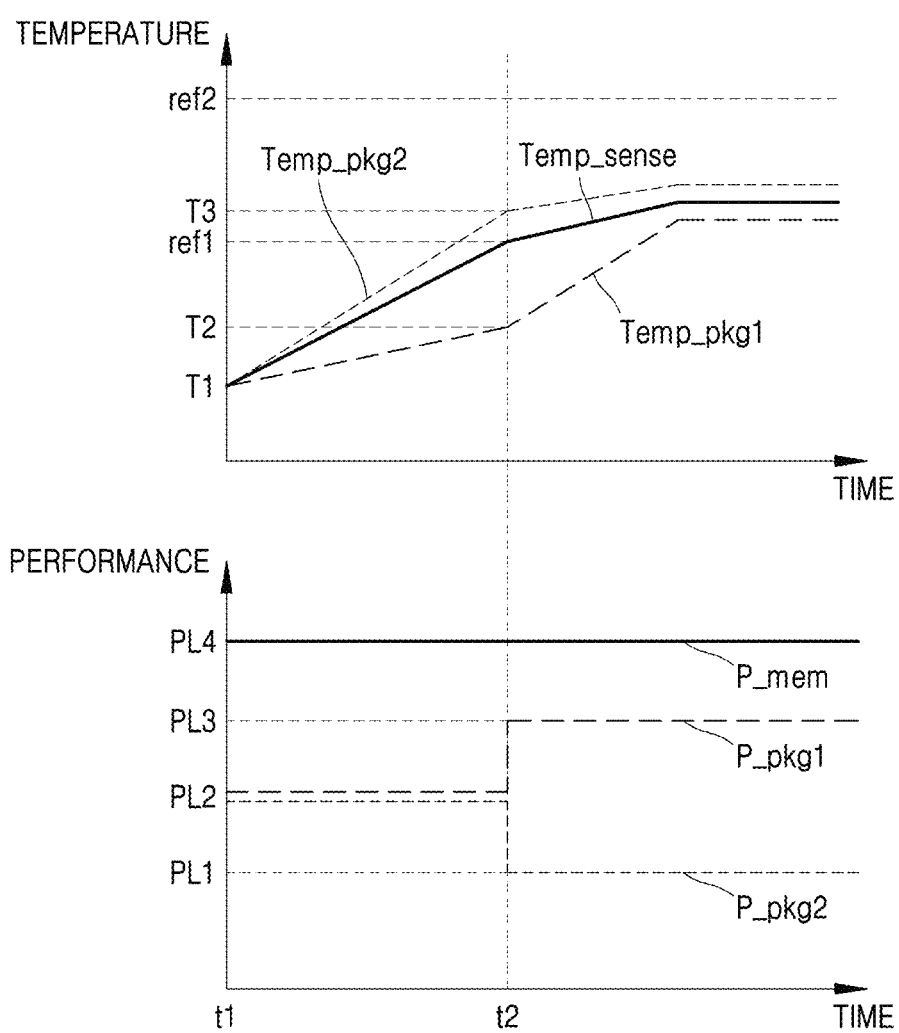
FIG. 4 is a view illustrating a temperature change and a performance level change according to at least one example embodiment of the inventive concepts.

FIG. 4 is a view illustrating a temperature change and a performance level change according to at least one example embodiment of the inventive concepts. FIG. 4 is described below with reference to FIG. 1 together. For the convenience of description and sake of clarity, only the first and second memory packages 220 and 230 are described, but the example embodiments are not limited thereto. That is, descriptions of the first and second memory packages 220 and 230 below may be applied to the other memory packages included in the memory system 200. For example, it may be assumed that the heat dissipation efficiency of the first memory package 220 is higher than that of the second memory package 230. Additionally and/or alternatively, it may be assumed that a distance between the first memory package 220 and the heat sink is shorter than a distance between the second memory package 230 and the heat sink.

Referring to FIG. 4, at the first time point t1, a temperature Temp_pkg1 of the first memory package 220, a temperature Temp_pkg2 and a detection temperature Temp_sense of the second memory package 230 may be at a first temperature level T1, but the example embodiments are not limited thereto. The detection temperature Temp_sense may be a temperature detected by the temperature sensor 260. The detection temperature Temp_sense may be a temperature of the substrate on which the first memory package 220 and the second memory package 230 are mounted. Although it is illustrated that the detection temperature Temp_sense is higher than the temperature Temp_pkg1 of the first memory package 220 and lower than the temperature Temp_pkg2 of the second memory package 230, the example embodiments are not limited thereto.

At the first time point t1, the performance level P_pkg1 of the first memory package 220 and the performance level P_pkg2 of the second memory package 230 may be at a second performance level PL2, but is not limited thereto. The overall performance P_mem of the memory system 200 may be at a fourth performance level PL4. As a write operation is performed, the temperature Temp_pkg1 of the first memory package 220 and/or the temperature Temp_pkg2 of the second memory package 230 may increase. In some example embodiments, performance level may refer to data I/O speed, etc., but the example embodiments are not limited thereto.

At the second time point t2, the detection temperature Temp_sense may reach a first reference level ref1. When the detection temperature Temp_sense reaches the first reference level ref1, the memory controller 210 may perform a performance adjusting operation on the first and/or second memory packages 220 and 230, etc., but the example embodiments are not limited thereto. In at least one example embodiment, the performance level of the first memory package 220 may be increased to a third performance level PL3, and the performance level of the second memory package 230 may be lowered to a first performance level PL1, but are not limited thereto. In some example embodiments, a performance increase width of the first memory package 220 may be equal to a performance decrease width of the second memory package 230, but the example embodiments are not limited thereto. Accordingly, the overall performance of the memory system 200 may be maintained at a fourth performance level PL4.

Because the performance of the first memory package 220 is increased and the performance of the second memory package 230 is decreased, the temperature Temp_pkg1 of the first memory package 220 may rise faster than before, and the temperature Temp_pk2 of the second memory package 230 may rise more slowly than before. However, because the degree of heat generation of the first memory package 220 is relatively lower than that of the second memory package 230, the detection temperature Temp_sense may rise more slowly than before, etc.

As the memory controller 210 increases the performance of the first memory package 220 and decreases the performance of the second memory package 230, the detection temperature Temp_sense may not reach a second reference level ref2, and/or the detection temperature Temp_sense may rise more slowly and may reach the second reference level ref2 at a later point in time. Accordingly, the throttling operation for lowering the performance of both the first and second memory packages 220 and 230 may be delayed.

When the temperature of the memory system 200 exceeds the second reference level ref2, the memory controller 210 may perform the throttling operation to lower the performance of both the first and second memory packages 220 and 230, etc. Accordingly, when the temperature of the memory system 200 exceeds the second reference level ref2, the overall performance of the memory system 200 may decrease. The second reference level ref2 may indicate a temperature that is a reference for the throttling operation (e.g., a throttling threshold level, etc.).

In the memory system 200 according to at least one example embodiment of the inventive concepts, when the detection temperature Temp_sense exceeds the first reference level ref1, the performance of the memory packages is adjusted to be different, thereby maintaining and/or uniformly maintaining the overall performance of the memory system 200, etc., but the example embodiments are not limited thereto.

Figure 5:
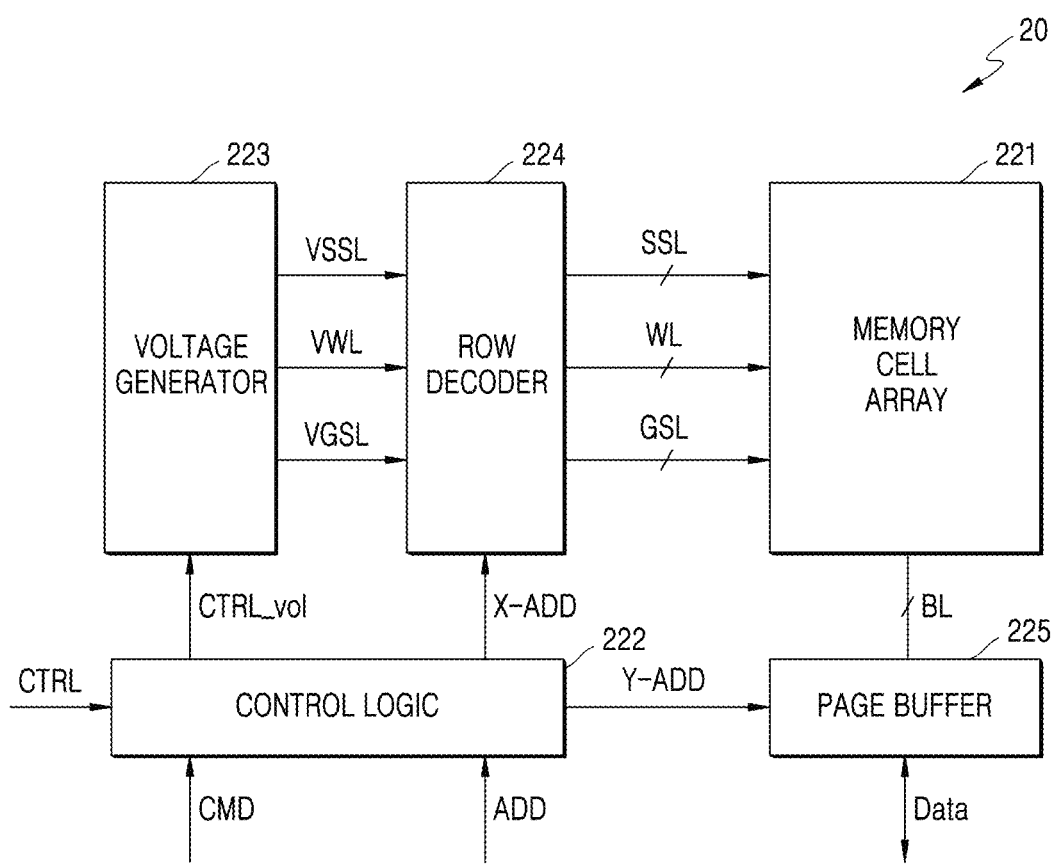
FIG. 5 is a block diagram illustrating a non-volatile memory (NVM) according to at least one example embodiment of the inventive concepts.

FIG. 5 is a block diagram illustrating an NVM 20 according to at least one example embodiment of the inventive concepts.

The NVM 20 of FIG. 5 may correspond to at least one of the NVMs NVM11 to NVM14 and NVM21 to NVM24 shown in FIG. 1, but the example embodiments are not limited thereto.

Referring to FIG. 5, the NVM 20 includes a memory cell array 221, a control logic 222 (e.g., control logic circuitry, etc.), a voltage generator 223, a row decoder 224, and/or a page buffer 225, etc., but the example embodiments are not limited thereto, and for example, the NVM 20 may include a greater or lesser number of constituent components, etc. According to some example embodiments, the control logic 222, voltage generator 223, row decoder 224, and/or page buffer 225, etc., may be implemented as processing circuitry. The processing circuitry may include hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The memory cell array 221 may be connected to one or more string select lines SSL, a plurality of word lines WL, and one or more ground select lines GSL, and may also be connected to a plurality of bit lines BL, etc. The memory cell array 221 may include a plurality of memory cells arranged in regions in which the word lines WL intersect with the bit lines BL, etc.

The control logic 222 (e.g., control logic circuitry, etc.) may receive a command (CMD and/or an internal command) and an address ADD from the memory controller 210, and/or may also receive a control signal CTRL for controlling various functional blocks inside the NVM 20 from the memory controller 210, etc. The control logic 222 may output various control signals for writing data to the memory cell array 221 and/or read data from the memory cell array 221, based on the command CMD, the address ADD, and the control signal CTRL. Accordingly, the control logic 222 may generally control various operations in the memory device 20, etc.

Various control signals output from the control logic 222 may be provided to the voltage generator 223, the row decoder 224, and/or the page buffer 225, etc. In at least one example embodiment, the control logic 222 may provide the voltage control signal CTRL_vol to the voltage generator 223, provide a row address X_ADD to the row decoder 224, and/or provide a column address Y_ADD to the page buffer 225, etc., but is not limited thereto.

The voltage generator 223 may generate various types of voltages to perform program, read, and/or erase operations on the memory cell array 221 based on the voltage control signal CTRL_vol, etc. In at least one example embodiment, the voltage generator 223 may generate a first driving voltage VWL for driving the word lines WL, a second driving voltage VSSL for driving the string select lines SSL, and/or a third driving voltage VGSL for driving the ground select lines GSL, etc., but is not limited thereto. Here, the first driving voltage VWL may be a program voltage (or a write voltage), a read voltage, an erase voltage, a pass voltage, and/or a program verification voltage, etc., but the example embodiments are not limited thereto. Also, the second driving voltage VSSL may be a string selection voltage, that is, an ON voltage or an OFF voltage, etc. Furthermore, the third driving voltage VGSL may be a ground selection voltage, that is, an ON voltage or an OFF voltage, but the example embodiments are not limited thereto.

The row decoder 224 may be connected to the memory cell array 221 through the word lines WL, and may enable some of the word lines WL in response to a row address X_ADD received from the control logic 222. In at least one example embodiment, during a read operation, the row decoder 224 may apply a read voltage to a selected word line and apply a pass voltage to an unselected word line.

During a program operation, the row decoder 224 may apply a program voltage to a selected word line and a pass voltage to an unselected word line. In at least one example embodiment, in at least one of program loops, the row decoder 224 may apply a program voltage to a selected word line and an additionally selected word line.

The page buffer 225 may be connected to the memory cell array 221 through the bit lines BL. In at least one example embodiment, during a read operation, the page buffer 225 may operate as a sense amplifier to output data stored in the memory cell array 221. During the program operation, the page buffer 225 may operate as a write driver to input data to be stored in the memory cell array 221.

Figure 6:
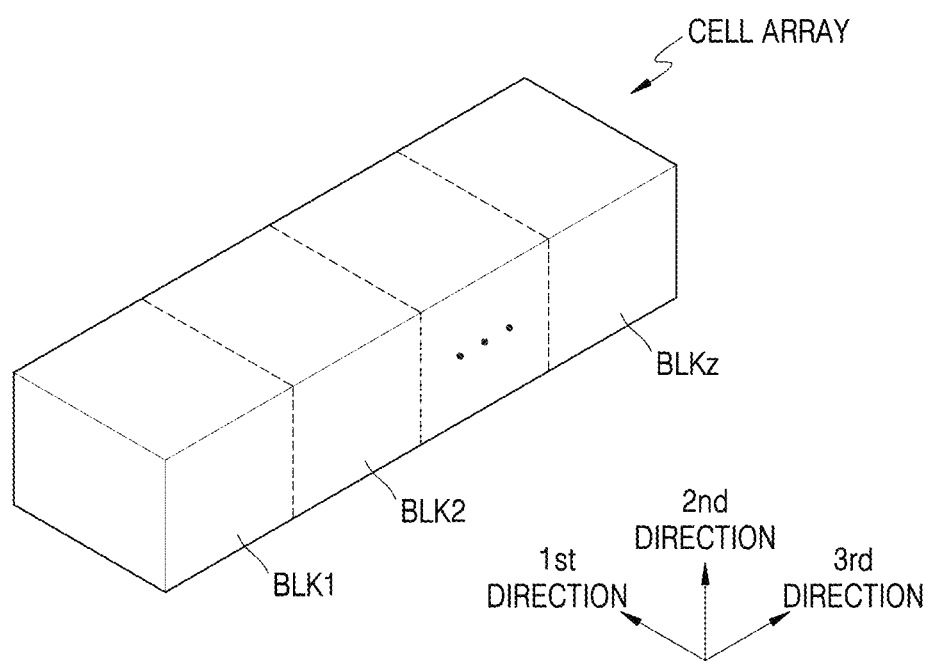
FIG. 6 is a block diagram illustrating a memory cell array included in a memory system according to at least one example embodiment of the inventive concepts.

FIG. 6 is a block diagram illustrating a memory cell array included in a memory system according to at least one example embodiment of the inventive concepts. In at least one example embodiment, FIG. 6 illustrates a cell array including three-dimensional (3D) NAND and/or vertical NAND (VNAND) memory cells, but the example embodiments are not limited thereto.

Referring to FIG. 6, the memory cell array includes a plurality of memory blocks BLK1 to BLKz (BLK), but is not limited thereto. Each memory block BLK has a 3D structure (and/or a vertical structure). For example, each memory block BLK includes structures extending in first to third directions, but are not limited thereto. For example, each memory block BLK includes a plurality of NAND strings NS extending in the second direction, etc. For example, a plurality of NAND strings NS may be provided in the first and third directions, etc.

Each NAND string NS is connected to a bit line BL, a string select line SSL, a ground select line GSL, word lines WL, and/or a common source line CSL, etc. That is, each memory block BLK may be connected to a plurality of bit lines BL, a plurality of string select lines SSL, a plurality of ground select lines GSL, the word lines WL, and/or a common source line CSL, etc. The memory blocks BLK1 to BLKz are described in more detail with reference to FIG. 7.

Figure 7:
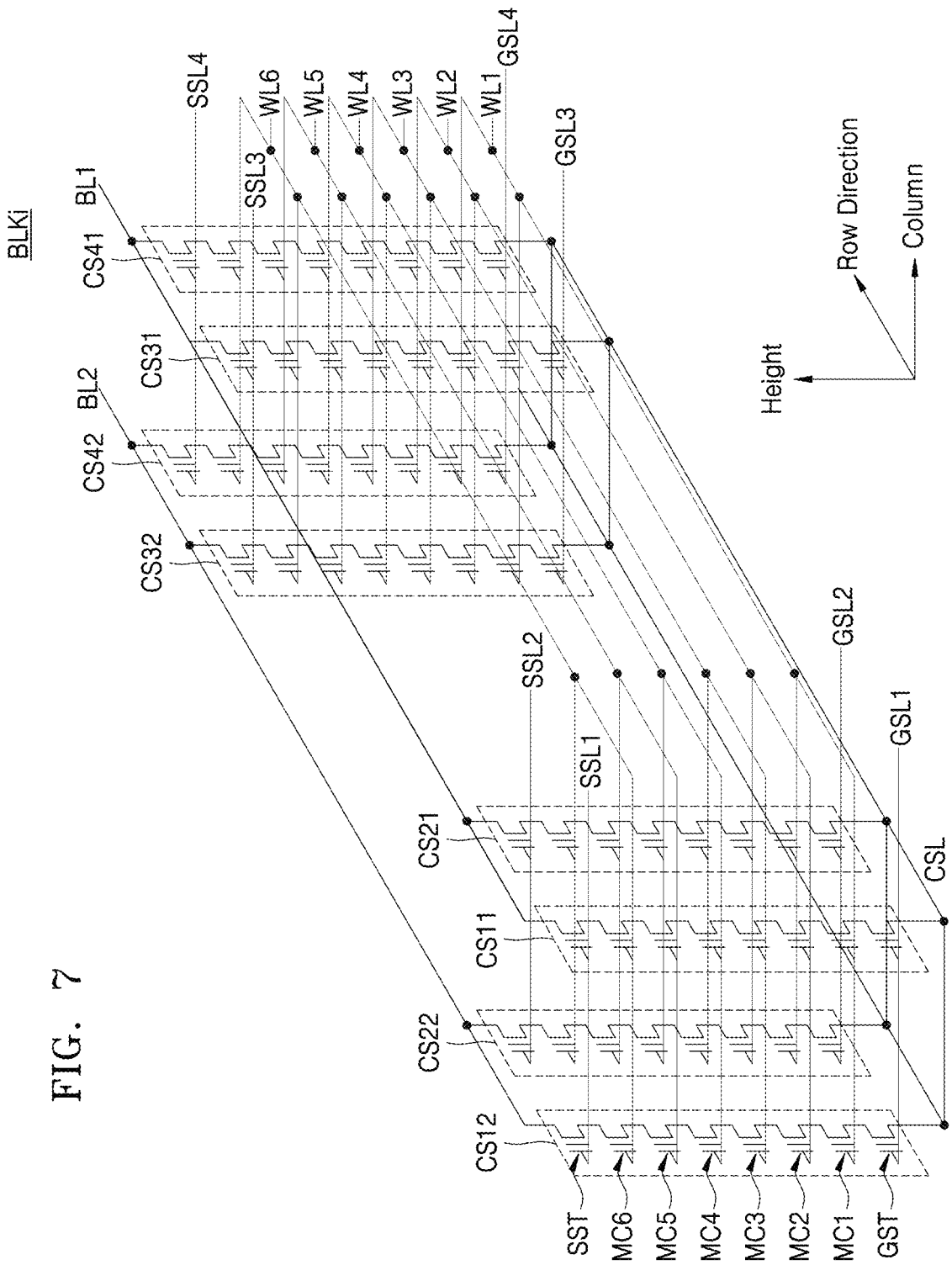
FIG. 7 is a circuit diagram illustrating a memory block BLKi according to at least one example embodiment of the inventive concepts.

FIG. 7 is a circuit diagram illustrating a memory block BLKi according to at least one example embodiment of the inventive concepts. For example, one of the memory blocks BLK1 to BLKz of the memory cell array of FIG. 6 is illustrated in FIG. 7, but the example embodiments are not limited thereto.

The memory block BLKi includes a plurality of cell strings, e.g., CS11 to CS41 and CS12 to CS42, etc., but the example embodiments are not limited thereto. The cell strings CS11 to CS41 and CS12 to CS42 may be arranged in a row direction and a column direction to form rows and columns. Each of the cell strings CS11 to CS41 and CS12 to CS42 includes a ground select transistor GST, a plurality of memory cells, e.g., MC1 to MC6, etc., and/or a string select transistor SST, but is not limited thereto. The ground select transistor GST, the memory cells MC1 to MC6, and the string select transistor SST of each of the cell strings CS11 to CS41 and CS12 to CS42 may be stacked in a height direction perpendicular to the substrate, but the example embodiments are not limited thereto.

Rows of the cell strings CS11 to CS41 and CS12 to CS42 are respectively connected to different string select lines, e.g., SSL1 to SSL4, etc. For example, the string select transistors SST of the cell strings CS11 and CS12 are commonly connected to the string select line SSL1. The string select transistors SST of the cell strings CS21 and CS22 are commonly connected to the string select line SSL2. The string select transistors SST of the cell strings CS31 and CS32 are commonly connected to the string select line SSL3. The string select transistors SST of the cell strings CS41 and CS42 are commonly connected to the string select line SSL4.

Columns of the cell strings CS11 to CS41 and CS12 to CS42 are respectively connected to different bit lines, e.g., BL1 and BL2, etc. For example, the string select transistors SST of the cell strings CS11 to CS41 are commonly connected to the bit line BL1. The string select transistors SST of the cell strings CS12 to CS42 are commonly connected to the bit line BL2.

Rows of the cell strings CS11 to CS41 and CS12 to CS42 are respectively connected to different ground select lines, e.g., GSL1 to GSL4, etc. For example, the ground select transistors GST of the cell strings CS11 and CS12 are commonly connected to the ground select line GSL1. The ground select transistors GST of the cell strings CS21 and CS22 are commonly connected to the ground select line GSL2. The ground select transistors GST of the cell strings CS31 and CS32 are commonly connected to the ground select line GSL3. The ground select transistors GST of the cell strings CS41 and CS42 are commonly connected to the ground select line GSL4.

Memory cells positioned at the same height from the substrate (and/or the ground select transistors GST) may be commonly connected to one word line, and memory cells positioned at different heights may be connected to different word lines, e.g., WL1 to WL6, respectively, but the example embodiments are not limited thereto. For example, the memory cells MC1 are commonly connected to the word line WL1. The memory cells MC2 are commonly connected to the word line WL2. The memory cells MC3 are commonly connected to the word line WL3. The memory cells MC4 are commonly connected to the word line WL4. The memory cells MC5 are commonly connected to the word line WL5. The memory cells MC6 are commonly connected to the word line WL6. The ground select transistors GST of the cell strings CS11 to CS41 and CS12 to CS42 are commonly connected to the common source line CSL.

Figure 8:
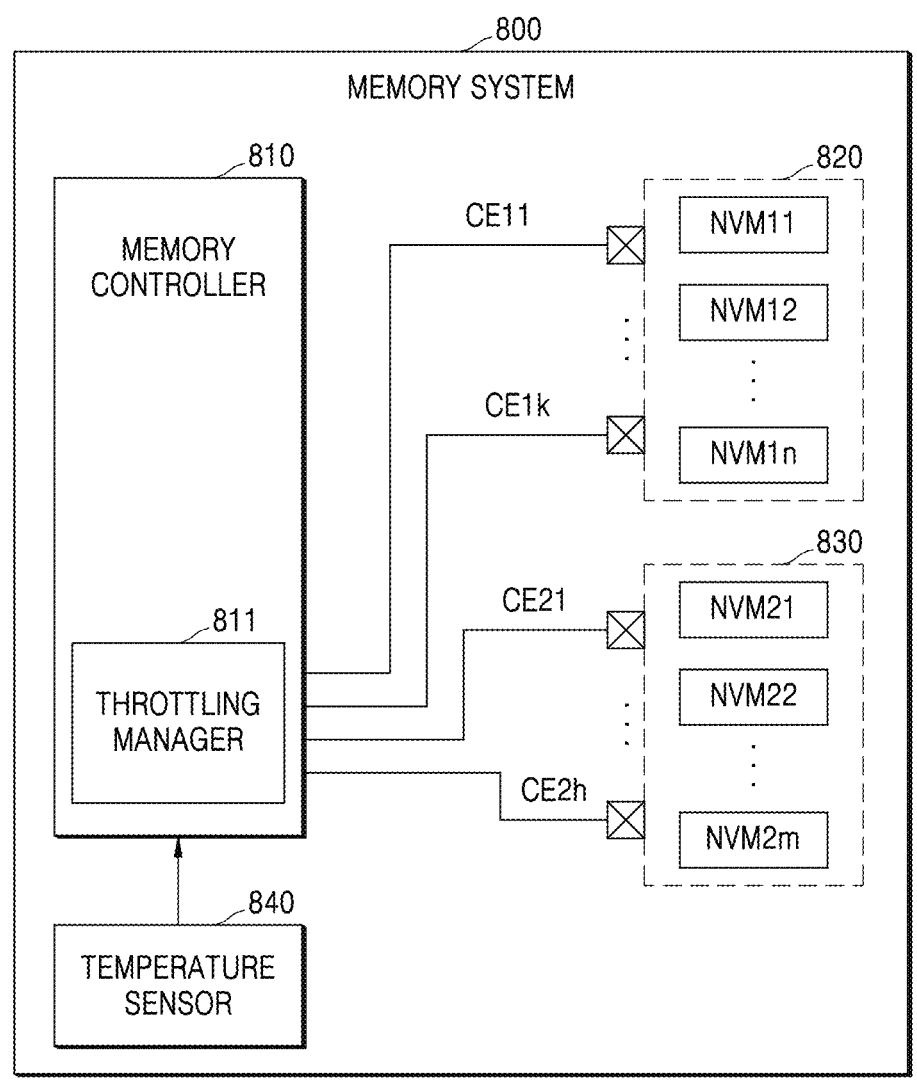
FIG. 8 is a block diagram illustrating a memory system according to at least one example embodiment of the inventive concepts.

FIG. 8 is a block diagram illustrating a memory system 800 according to at least one example embodiment of the inventive concepts.

Referring to FIG. 8, the memory system 800 may include a memory controller 810, a first memory package 820, a second memory package 830, and/or a temperature sensor 840, etc., but the example embodiments are not limited thereto, and for example, may include a greater or lesser number of constituent components, etc.

The first memory package 820 may include n NVMs NVM11 to NVM1n (here, n is a natural number of 1 or greater). The first memory package 820 may be connected to the memory controller 810 through k chip enable pins CE11 to CE1k (k is a natural number of 1 or greater). The number of NVMs included in the first memory package 820 may be equal to or greater than the number of chip enable pins. That is, n may be k or greater. Each of the n NVMs NVM11 to NVM1n may be connected to at least one of the chip enable pins CE11 to CE1k, and may be enabled according to chip enable signals received through the connected chip enable pins. Because n may be k or greater, one chip enable pin may be connected to one or more NVMs.

The second memory package 830 may include m NVMs NVM21 to NVM2m (here, m is a natural number of 1 of greater). The second memory package 830 may be connected to the memory controller 810 through h chip enable pins CE21 to CE2h (h is a natural number of 1 or greater). The number of NVMs included in the second memory package 830 may be equal to or less than the number of chip enable pins. That is, m may be h or greater. Each of the m NVMs NVM21 to NVM2m may be connected to at least one of the chip enable pins CE21 to CE2h, and may be enabled according to chip enable signals received through the connected chip enable pins. Because m may be he or greater, one chip enable pin may be connected to one or more NVMs.

In some example embodiments, the first memory package 820 may have better heat dissipation efficiency than the second memory package 830, but the example embodiments are not limited thereto. The memory controller 810 may have a relatively high degree of heat generation among components included in the memory system 800, and in some example embodiments, the first memory package 820 may be located to be farther than the second memory package 830 to have better heat dissipation efficiency than that of the second memory package 830, but the example embodiments are not limited thereto. That is, a distance between the first memory package 820 and the memory controller 810 may be greater than a distance between the second memory package 830 and the memory controller 810, but the example embodiments are not limited thereto.

In some example embodiments, a distance between the first memory package 820 and a heat sink (not shown) may be shorter than a distance between the second memory package 830 and the heat sink, but the example embodiments are not limited thereto. A heat sink (not shown) may have a structure to dissipate heat of the memory system 800 to the outside (e.g., externally), etc., but is not limited thereto.

The throttling manager 811 may adjust the performance of each of the first and/or second memory packages 820 and 830 by adjusting the number of enabled NVMs, but is not limited thereto. In at least one example embodiment, during the performance adjusting operation, the throttling manager 811 may increase the performance of the first memory package 820 and/or decrease the performance of the second memory package 830, but is not limited thereto. For example, the throttling manager 811 may provide an enable signal to more pins among the k chip enable pins CE11 to CE1k, thereby increasing the number of NVMs performing a write operation in the first memory package 820, etc. The throttling manager 811 may provide an enable signal to a smaller number of pins among the h chip enable pins CE21 to CE2h, thereby decreasing the number of NVMs performing a write operation in the second memory package 830, etc.

Figure 9:
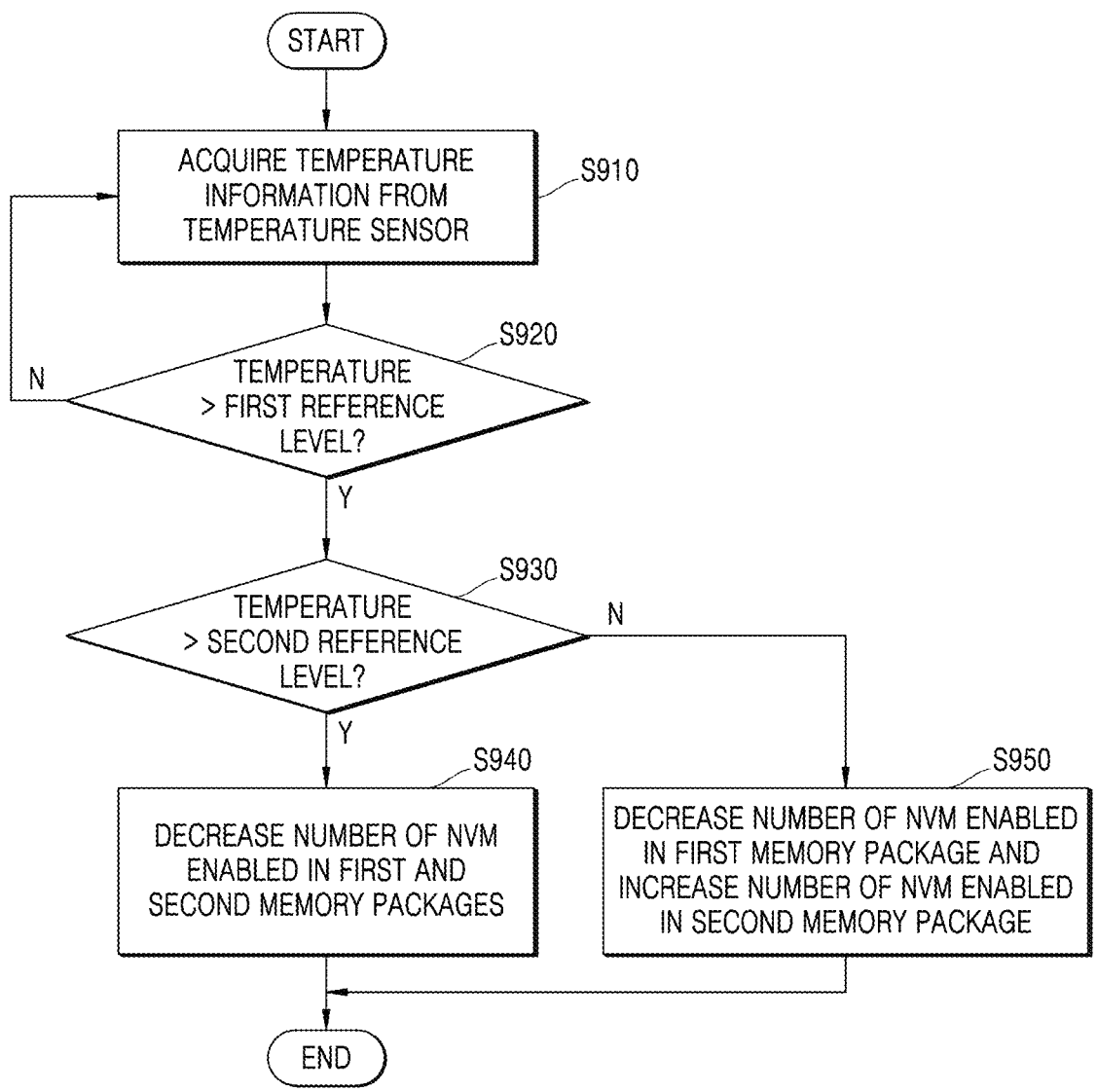
FIG. 9 is a flowchart illustrating an operating method of a memory controller according to at least one example embodiment of the inventive concepts.

FIG. 9 is a flowchart illustrating an operating method of the memory controller 810 according to at least one example embodiment of the inventive concepts. The operating method of the memory controller 810 of FIG. 9 may include a plurality of operations S910 to S950. FIG. 9 is described below with reference to FIG. 8 together, but the example embodiments are not limited thereto.

In operation S910, the memory controller 810 may acquire temperature information of the memory system 800 from the temperature sensor 840. The memory controller 810 may periodically acquire temperature information and/or aperiodically acquire temperature information, etc. In some example embodiments, the temperature information of the memory system 800 may be temperature information of the substrate (not shown) on which the first and second memory packages 820 and 830 are mounted, but is not limited thereto. In some example embodiments, the temperature sensor 840 may detect temperature information of each of the first and second memory packages 820 and 830, but the example embodiments are not limited thereto.

In operation S920, the memory controller 810 may compare the temperature information acquired from the temperature sensor 840 with the first reference level (e.g., the first temperature threshold level, etc.). If the temperature of the memory system 800 exceeds the first reference level, the memory controller 810 may perform operation S930, and if the temperature of the memory system 800 does not exceed the first reference level, the memory controller 810 may perform operation S910 again.

In operation S930, the memory controller 810 may compare the temperature information acquired from the temperature sensor 840 with the second reference level (e.g., the second temperature threshold level, etc.). In operation S930, if the temperature of the memory system 800 exceeds the second reference level, the memory controller 810 may perform operation S940, and if the temperature of the memory system 800 does not exceed the first reference level, the memory controller 810 may perform operation S950.

Although operations S920 and S930 are described as being performed by the memory controller 810, operations S920 and S930 may also be performed by the temperature sensor 840, etc., but the example embodiments are not limited thereto.

In operation S940, the memory controller 810 may reduce the number of NVMs enabled in the first and second memory packages 820 and 830. In at least one example embodiment, the memory controller 810 may lower the performance of the first memory package 820 by providing an enable signal to a smaller number of chip enable pins among the k chip enable pins CE11 to CE1k, etc. The memory controller 810 may lower the performance of the second memory package 830 by providing an enable signal to a smaller number of chip enable pins among the h number of chip enable pins CE21 to CE2h, etc.

In operation S950, the memory controller 810 may decrease the number of NVMs enabled in the first memory package 820 and/or may increase the number of NVMs enabled in the second memory package 830, but is not limited thereto. In at least one example embodiment, the memory controller 810 may lower the performance of the first memory package 820 by providing an enable signal to a smaller number of chip enable pins among the k chip enable pins CE11 to CE1k, etc. The memory controller 810 may increase the performance of the second memory package 830 by providing an enable signal to a greater number of chip enable pins among the h chip enable pins CE21 to CE2h, etc.

Figure 10:
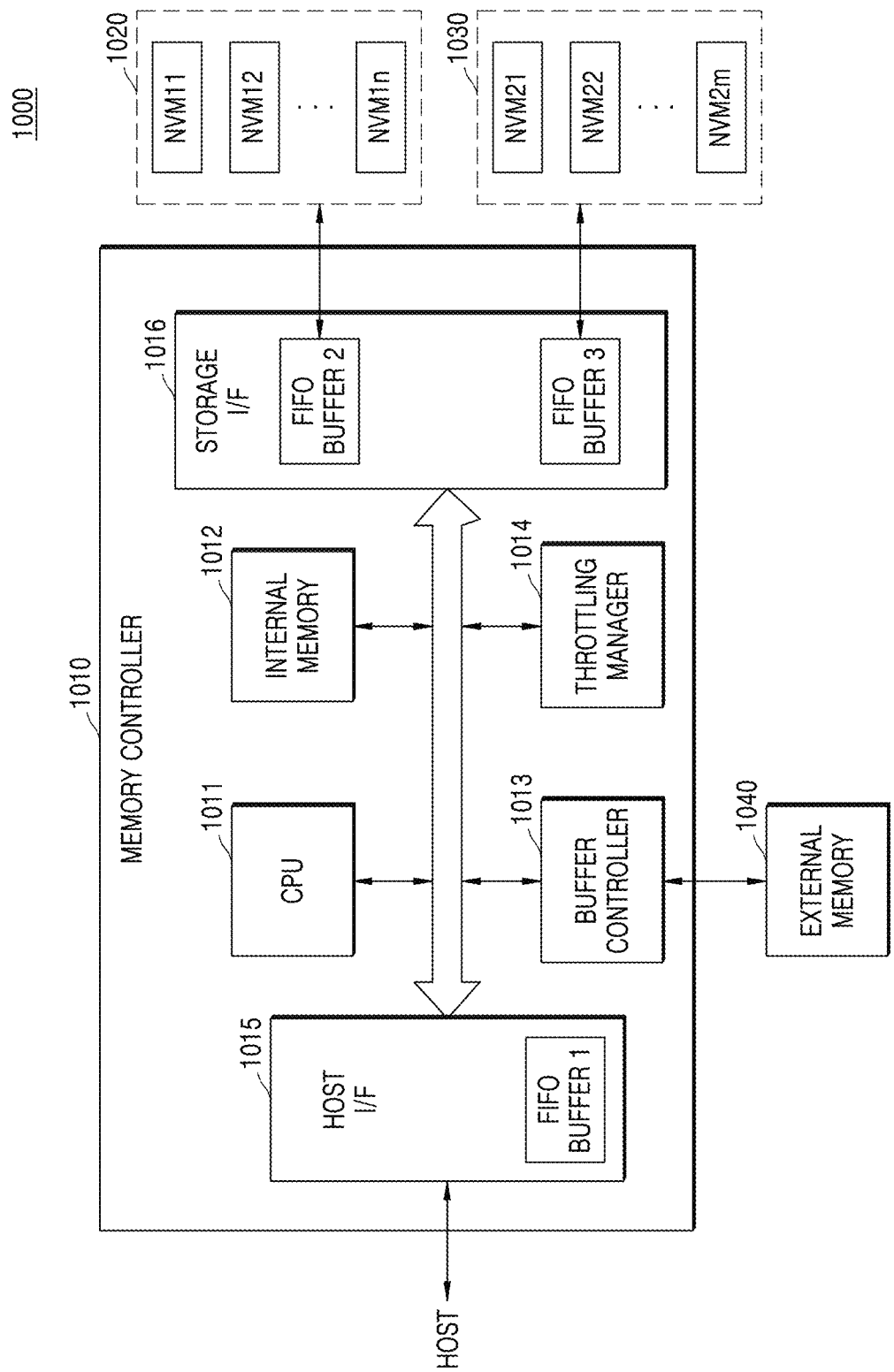
FIG. 10 is a block diagram illustrating a memory system according to at least one example embodiment of the inventive concepts.

FIG. 10 is a block diagram illustrating a memory system 1000 according to at least one example embodiment of the inventive concepts.

Referring to FIG. 10, the memory system 1000 may include a memory controller 1010, a first memory package 1020, a second memory package 1030, and/or an external memory 1040, etc., but the example embodiments are not limited thereto. The memory controller 1010, the first memory package 1020, the second memory package 1030, and/or the external memory 1040 may be mounted on a substrate and may be interconnected through wirings inside or outside the substrate, but the example embodiments are not limited thereto.

The memory controller 1010 may include a CPU 1011, an internal memory 1012, a buffer controller 1013, a throttling manager 1014, a host interface (I/F) 1015, and/or a storage I/F 1016, etc., but is not limited thereto.

The CPU 1011 may control an overall operation of the memory controller 1010. The memory controller 1010 may include one or more CPUs 1011, etc. The CPU 1011 may include at least one processor core, etc. When the CPU 1011 includes one core, the CPU 1011 may be referred to as a single-core processor, and when the CPU 1011 includes a plurality of cores, the CPU 1011 may be referred to as a multi-core processor. The CPU 1011, the internal memory 1012, the buffer controller 1013, the throttling manager 1014, the host I/F 1015, and the storage I/F 1016 may have a single-chip form based on SoC technology, but the example embodiments are not limited thereto.

The CPU 1011 may execute firmware and/or computer readable instructions and/or programs, etc., stored in the internal memory 1012, but is not limited thereto. Additional information (e.g., mapping information, etc.) processed by the firmware, etc., may be stored in a data area of the internal memory 1012. The internal memory 1012 may be provided inside the CPU 1011 and/or may be provided outside (e.g., external to) the CPU 1011, etc.

The host I/F 1015 may exchange commands, addresses, and/or data with a host HOST under the control by the CPU 1011. The host I/F 1015 may support one or more of various I/F protocols such as universal serial bus (USB), multimedia card (MMC) I/F, PCI express (PCI-E) I/F, serial advanced technology attachment (SATA), parallel advanced technology attachment (PATA), small computer system (SCSI) I/F, serial attached SCSI (SAS), enhanced small disk (ESDI) I/F), integrated drive electronics (IDE) I/F, etc., but is not limited thereto. The buffer controller 1013 may control write/read/erase operations of the internal memory 1012 and the external memory 1040 in response to the control by the CPU 1011. The storage I/F 1016 may transmit/receive data between the internal memory 1012 and/or the external memory 1040 and the first and second memory packages 1020 and 1030, etc.

When a read command is input from the host, read data read from the first and second memory packages 1020 and 1030 may be temporarily stored in the external memory 1040 through the storage interface 1016 and/or the buffer controller 1013. The read data temporarily stored in the external memory 1040 may be output to the host through the buffer controller 1013 and/or the host I/F 1015.

When a write command is input (e.g., received, etc.) from the host, the write command may be temporarily stored in a first first-in first-out (FIFO) buffer (or FIFO buffer 1) included in the host I/F 1015, and may be transferred to a second FIFO buffer (or FIFO buffer 2) and/or a third FIFO buffer (or FIFO buffer 3) included in the storage I/F 1016 according to a performance adjusting operation, but the example embodiments are not limited thereto. The second FIFO buffer 2 may temporarily store commands transferred to the first memory package 1020, and the third FIFO buffer 3 may temporarily store commands transferred to the second memory package 1030, etc. That is, the NVMs NVM11 to NVM1n included in the first memory package 1020 may perform an internal operation based on a command received from the second FIFIO buffer, and the NVMs NVM21 to NVM2m included in the second memory package 1030 may perform an internal operation based on a command received from the third FIFIO buffer, but the example embodiments are not limited thereto.

The throttling manager 1014 may perform a performance adjusting operation according to a temperature of the memory system 1010. In at least one example embodiment, during the performance adjusting operation, the throttling manager 1014 may increase the performance of the first memory package 1020 and/or decrease the performance of the second memory package 1030, etc. When the temperature of the memory system 1010 exceeds the first reference level, the throttling manager 1014 may increase the number of commands transferred from the first FIFO buffer to the second FIFO buffer, and may decrease the number of commands transferred from the first FIFO buffer to the third FIFO buffer, but is not limited thereto. When the temperature of the memory system 1010 exceeds the second reference level, the throttling manager 1014 may decrease the number of commands transferred from the first FIFO buffer to the second FIFO buffer, and may decrease the number of commands transferred from the first FIFO buffer to the third FIFO buffer, but is not limited thereto.

Figure 11:
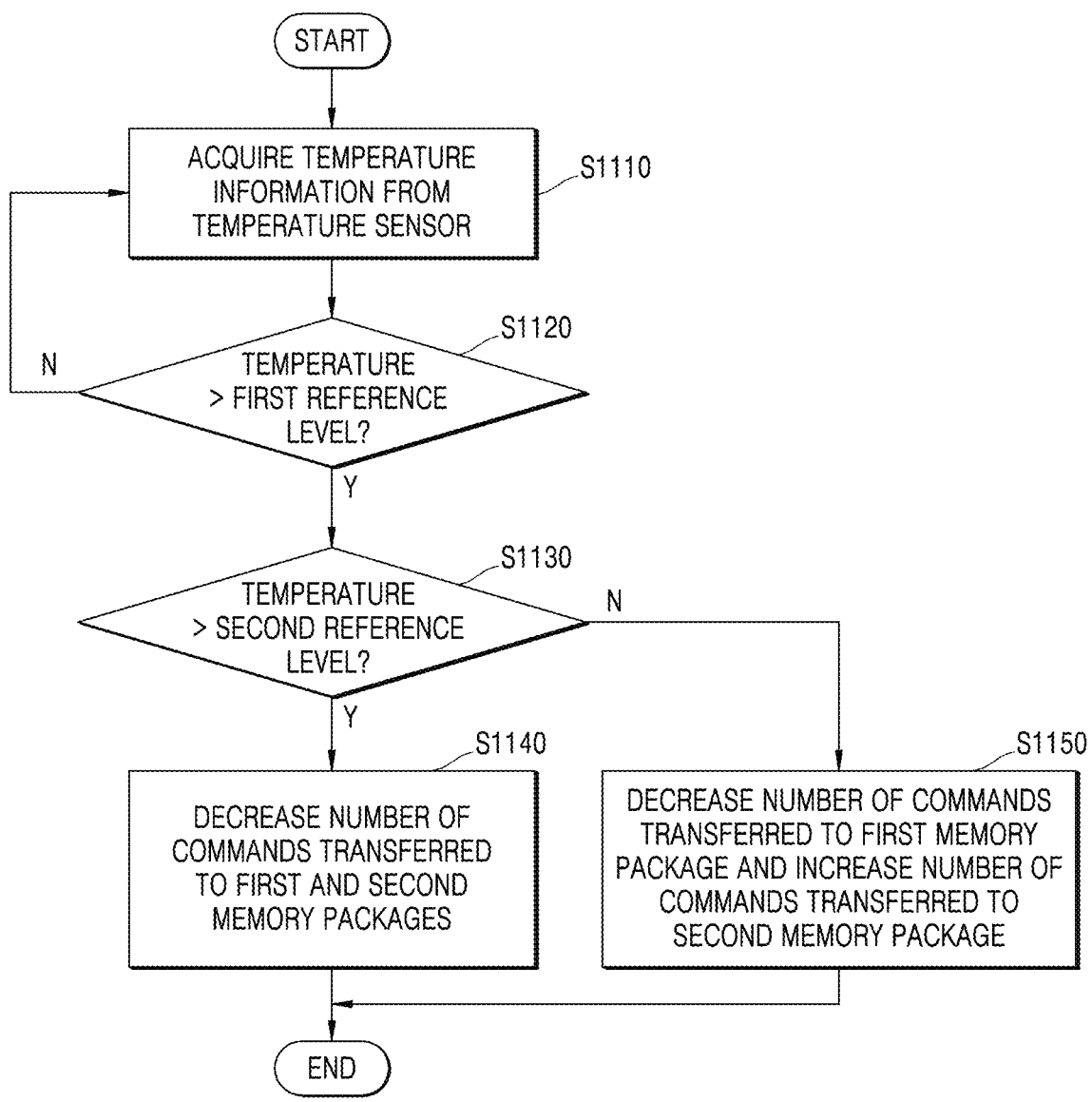
FIG. 11 is a flowchart illustrating an operating method of a memory controller according to at least one example embodiment of the inventive concepts.

FIG. 11 is a flowchart illustrating an operating method of the memory controller 1010 according to at least one example embodiment of the inventive concepts. The operating method of the memory controller 1010 according to FIG. 11 may include a plurality of operations S1110 to S1150, but is not limited thereto. FIG. 11 is described below with reference to FIG. 10 together, but the example embodiments are not limited thereto.

In operation S1110, the memory controller 1010 may acquire temperature information of the memory system 1000 from the temperature sensor 840. The memory controller 1010 may periodically acquire temperature information or aperiodically acquire temperature information, but is not limited thereto. In some example embodiments, the temperature information of the memory system 1000 may be temperature information of the substrate (not shown) on which the first and second memory packages 1020 and 1030 are mounted. In some example embodiments, the temperature sensor 840 may detect temperature information of each of the first and second memory packages 1020 and 1030, etc.

In operation S1120, the memory controller 1010 may compare the temperature information acquired from the temperature sensor 840 with the first reference level (e.g., the first temperature threshold level). If the temperature of the memory system 1000 exceeds the first reference level, the memory controller 1010 may perform operation S1130, and if the temperature of the memory system 1000 does not exceed the first reference level, the memory controller 1010 may perform operation S1110 again.

In operation S1130, the memory controller 1010 may compare the temperature information acquired from the temperature sensor 840 with the second reference level (e.g., the second temperature threshold level, etc.). In operation S1130, if the temperature of the memory system 1000 exceeds the second reference level, the memory controller 1010 may perform operation S1140, and if the temperature of the memory system 1000 does not exceed the second reference level, the memory controller 1010 may perform operation S1150.

Although operations S1120 and S1130 are described as being performed by the memory controller 1010, operations S1120 and S1130 may also be performed by the temperature sensor 840, etc.

In operation S1140, the memory controller 1010 may decrease the number of commands transferred to the first and/or second memory packages 820 and 830, among commands received from the host, but the example embodiments are not limited thereto. In at least one example embodiment, the memory controller 1010 may decrease the number of commands stored in the FIFO buffers that temporarily store commands transferred to the first and second memory packages 820 and 830, etc. Because fewer commands are transferred to the first and second memory packages 820 and 830, the performance of the first and second memory packages 820 and 830 may be lowered. In some example embodiments, the memory controller 1010 may reduce the number of commands transferred to the first and second memory packages 820 and 830 per time (e.g., per instance, etc.).

In operation S1150, the memory controller 1010 may decrease the number of commands transferred to the first memory package 820 among commands received from the host, and may increase the number of commands transferred to the second memory package 830 among commands received from the host, but the example embodiments are not limited thereto. In at least one example embodiment, the memory controller 1010 may decrease the number of commands stored in the second FIFO buffer that temporarily stores the commands transferred to the first memory package 820. Because fewer commands are transferred to the first memory package 820, the performance of the first memory package 820 may be lowered and/or reduced. At the same time, the memory controller 1010 may increase the number of commands stored in the third FIFO buffer that temporarily stores the commands transferred to the second memory package 830, etc. Because a larger number of commands are transferred to the second memory package 830, the performance of the second memory package 830 may be increased, etc.

Figure 12:
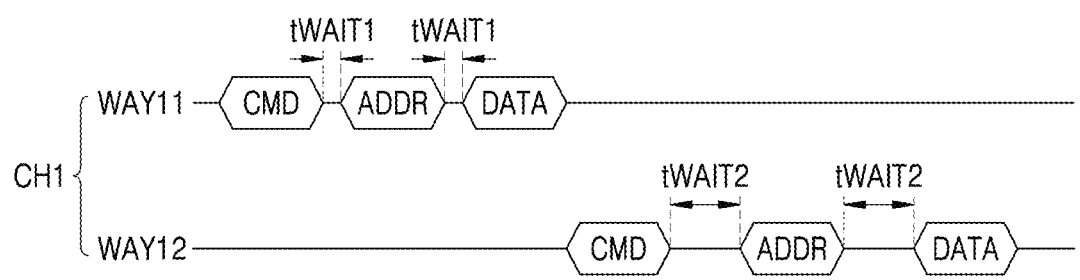
FIG. 12 is a view illustrating a performance adjusting operation according to at least one example embodiment of the inventive concepts.

FIG. 12 is a view illustrating a performance adjusting operation according to at least one example embodiment of the inventive concepts. FIG. 12 is described below with reference to FIG. 1 together, but the example embodiments are not limited thereto.

The memory controller 210 may perform a write operation on the first and second memory packages 220 and 230 in an interleaving manner through the first channel CH1. However, the example embodiments are not limited thereto, and the memory controller 210 may perform a write operation, for example, on the first and second memory packages 220 and 230 in parallel through the first and second channels CH1 and CH2, etc. The following description with respect to FIG. 12 may also be applied to a parallel write operation, but the example embodiments are not limited thereto. The memory controller 210 may transfer the command CMD, the address ADDR, and/or the data DATA to the first and second ways WAY11 and WAY22 respectively corresponding to the first memory package 220 and/or the second memory package 230 to perform a write operation, etc.

The memory controller 210 may set a dummy time between the command CMD, the address ADDR, and/or the data DATA during the performance adjusting operation, but the example embodiments are not limited thereto. In at least one example embodiment, when the temperature of the memory system 200 exceeds the first reference level, the memory controller 210 may increase the performance of the first memory package 220 and/or may lower the performance of the second memory package 230, etc. For example, the memory controller 210 may set a first dummy time tWAIT1 between the command CMD, the address ADDR, and/or the data DATA, etc., transferred through the first way WAY11 corresponding to the first memory package 220, and may set a second dummy time tWAIT2 between the command CMD, the address ADDR, and/or the data DATA, etc., transferred through the second way WAY12 corresponding to the second memory package 230, but the example embodiments are not limited thereto. The first dummy time tWAIT1 may be shorter than the second dummy time tWAIT2, but the example embodiments are not limited thereto.

That is, the memory controller 210 may control the first memory package 220 to process more commands by reducing a time interval between the command CMD, the address ADDR, and/or the data DATA transferred to the first memory package 220, and control the second memory package 230 to process less commands by increasing the time interval between the command CMD, the address ADDR, and/or the data DATA transferred to the second memory package 230, etc.

Figure 13:
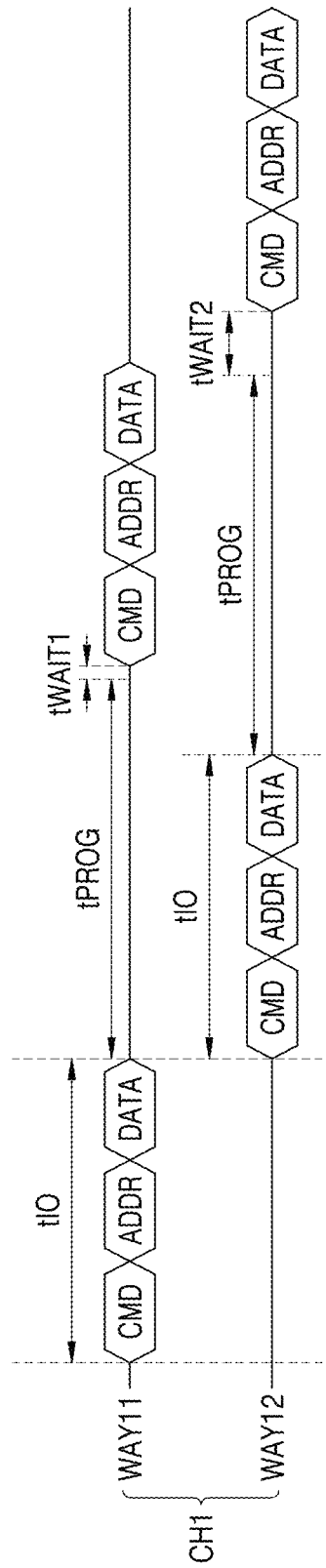
FIG. 13 is a view illustrating a performance adjusting operation according to at least one example embodiment of the inventive concepts.

FIG. 13 is a view illustrating a performance adjusting operation according to at least one example embodiment of the inventive concepts. FIG. 13 is described below with reference to FIG. 1 together, but the example embodiments are not limited thereto.

The memory controller 210 may perform a write operation on the first and/or second memory packages 220 and 230 in an interleaving manner through the first channel CH1, etc. However, the example embodiments are not limited thereto, and the memory controller 210 may perform a write operation on the first and second memory packages 220 and 230 in parallel through the first and second channels CH1 and CH2, etc. The following description with respect to FIG. 12 may also be applied to a parallel write operation, but the example embodiments are not limited thereto. In order to perform a write operation, the memory controller 210 may transfer the command CMD, the address ADDR, and/or the data DATA corresponding to the first memory package 220 and/or the second memory package 230, etc. A time during which the command CMD, the address ADDR, and/or the data DATA are transferred may be referred to as an I/O time tIO. After the I/O time tIO elapses, the NVM may perform an internal write operation during a write time tPROG, etc.

The memory controller 210 may set a dummy time after the lapse (e.g., expiration) of the write time tPROG during the performance adjusting operation. In at least one example embodiment, when the temperature of the memory system 200 exceeds the first reference level, the memory controller 210 may increase the performance of the first memory package 220 and/or lower the performance of the second memory package 230, etc. For example, when the first dummy time tWAIT1 elapses after the write time tPROG during which the NVM included in the first memory package 220 performs a write operation, the memory controller 210 may perform a next I/O operation, and when the second dummy time tWAIT2 elapses after the write time tPROG during which the NVM included in the second memory package 230 performs a write operation, the memory controller 210 may perform a next I/O operation, but the example embodiments are not limited thereto. The first dummy time tWAIT1 may be shorter than the second dummy time tWAIT2, but is not limited thereto.

That is, because a time interval between the I/O operations for the first WAY11 corresponding to the first package 220 is narrowed, the first memory package 220 may process more commands, and because a time interval between the I/O operations for the second way WAY12 corresponding to the second memory package 230 is lengthened, the second memory package 230 may process fewer commands.

Figure 14:
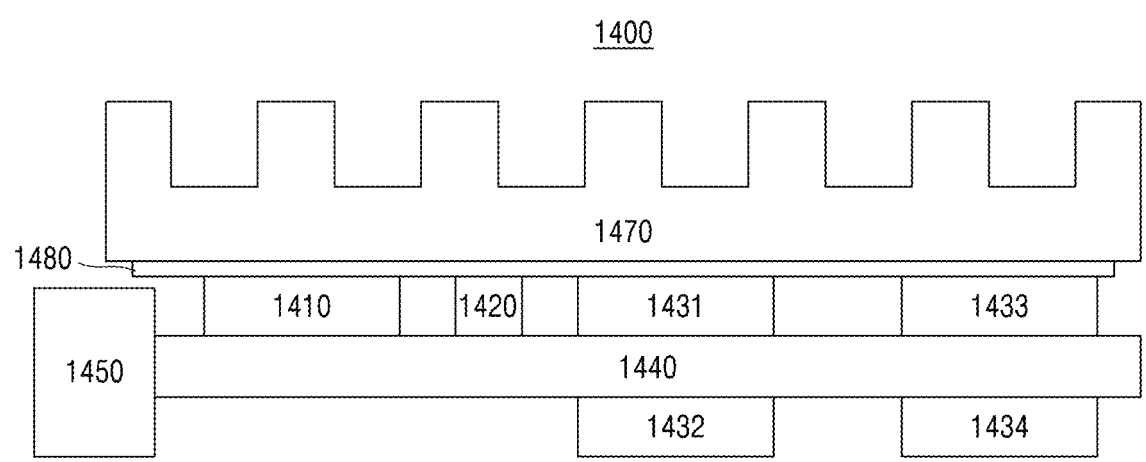
FIG. 14 is a cross-sectional view illustrating a structure of a memory system according to at least one example embodiment of the inventive concepts.

FIG. 14 is a cross-sectional view illustrating a structure of a memory system 1400 according to at least one example embodiment of the inventive concepts.

Referring to FIG. 14, the memory system 1400 may include a memory controller 1410, a temperature sensor 1420, and/or a plurality of memory packages, e.g., first to fourth memory packages 1431 to 1434, etc., mounted on a substrate 1440, but the example embodiments are not limited thereto. The substrate 1440 may be, for example, a printed circuit board (PCB), but is not limited thereto. Components connected to the substrate 1440 may be interconnected through a wiring structure (not shown) formed on the substrate 1440, but is not limited thereto.

A host I/F 1450 connected to a host may be formed on one side of the substrate 1440. The host I/F 1450 may be configured to be connected to the host according to a method that follows the SATA standard, the PATA standard, and/or the SCSI standard, etc. Here, the SATA standard may include all SATA series standards such as SATA-2, SATA-3, and external SATA (e-SATA), as well as the so-called SATA-1, etc. The PATA standard may include all integrated derive electronics (IDE) family standards such IDE, enhanced-IDE (E-IDE), etc.

The memory controller 1410, the temperature sensor 1420, and the first and third memory packages 1431 and 1433 may be mounted on a first surface of the substrate 1440, and the second and fourth memory packages 1432 and 1434 may be mounted on a second surface of the substrate 1440, but the example embodiments are not limited thereto.

A thermal pad 1480 may be provided on the first and third memory packages 1431 and 1433, and a heat sink 1470 may be provided on the thermal pad 1480, etc. The thermal pad 1480 may have a structure that transfers heat generated by a heat generating device to the heat sink 1470. The thermal pad 1480 may be formed of a metal material having high thermal conductivity to transfer heat from the heat generating device, etc. However, the example embodiments are not limited thereto, and the thermal pad 1480 may be selectively removed. The heat sink 1470 may have a structure with a large surface area to disperse heat received from the heat generating device and dissipate heat to the outside, but is not limited thereto.

As shown in FIG. 14, a distance between the first memory package 1431 and the heat sink 1470 may be shorter than a distance between the second memory package 1432 and the heat sink 1470, but is not limited thereto. Therefore, when a temperature acquired from the temperature sensor 1420 exceeds the first reference level, the memory controller 1410 according to at least one example embodiment of the inventive concepts may increase the performance of the first memory package 1431 and/or decrease the performance of the second memory package 1432, etc. When the temperature acquired from the temperature sensor 1420 exceeds the second reference level, the memory controller 1410 may lower the performance of the first and second memory packages 1431 and 1432, etc.

While various example embodiments of the inventive concepts have been particularly shown and described, it will be understood that various changes in form and details may be made therein without departing from the spirit and scope of the following claims.

What is claimed is:

1. A memory system comprising:
   a substrate;
   a first memory package mounted on the substrate and including a plurality of first non-volatile memories (NVMs);
   a second memory package mounted on the substrate and including a plurality of second NVMs; and
   a memory controller configured to,
     acquire a temperature of the substrate from a temperature sensor,
     increase performance of at least one of the plurality of first NVMs, the plurality of first NVMs having a first heat dissipation efficiency, and lower performance of at least one of the plurality of second NVMs, the plurality of second NVMs having a second heat dissipation efficiency lower than the first heat dissipation efficiency, during a same time period, based on the acquired temperature of the substrate and a first temperature threshold level, and
     decrease the performance of the at least one of the plurality of first NVMs and the at least one of the plurality of second NVMs in response to the temperature of the substrate exceeding a second temperature threshold level greater than the first temperature threshold level.

2. The memory system of claim 1, wherein the memory controller is further configured to:
   increase a number of commands provided to the first memory package and decrease a number of commands provided to the second memory package based on the temperature of the substrate and the first temperature threshold level.

3. The memory system of claim 2, wherein the memory controller includes:
   a first buffer configured to temporarily store at least one command received from a host;
   a second buffer configured to temporarily store at least one first internal command to be transferred to the first memory package; and
   a third buffer configured to temporarily store at least one second internal command to be transferred to the second memory package, and
   the first buffer is configured to transfer the at least one first internal command to the second buffer, and transfer the at least one second internal command to the third buffer, and the at least one first internal command includes a greater number of commands than the number of the at least one second internal command in response to the temperature of the substrate.

4. The memory system of claim 1, wherein the memory controller is configured to increase a number of enabled NVMs among the first NVMs in the first memory package, and decrease a number of enabled NVMs among the second NVMs in the second memory package, based on the temperature of the substrate and the first temperature threshold level.

5. The memory system of claim 4, wherein
   the first memory package is connected to the memory controller through a plurality of first chip enable pins;
   the second memory package is connected to the memory controller through a plurality of second chip enable pins; and
   the memory controller is further configured to increase a number of first chip enable pins receiving an enable signal among the plurality of first chip enable pins, and decrease a number of second chip enable pins receiving the enable signal among the plurality of second chip enable pins, based on the temperature of the substrate and the first temperature threshold level.

6. The memory system of claim 1, wherein the memory controller is configured to:
   in response to a first dummy time elapsing after providing a first command to the first memory package, provide a first address for the first command to the first memory package; and
   in response to a second dummy time elapsing after providing a second command to the second memory package, provide a second address for the second command to the second memory package, and
   the first dummy time is shorter than the second dummy time.

7. The memory system of claim 1, wherein the memory controller is configured to:
   in response to a third dummy time elapsing after a first internal write operation on at least one of the first NVMs is completed, provide a first command to the first memory package; and
   in response to a fourth dummy time elapsing after a second internal write operation on at least one of the second NVMs is completed, provide a second command to the second memory package, and
   the third dummy time is shorter than the fourth dummy time.

8. The memory system of claim 1, wherein a distance between the first memory package and the memory controller is shorter than a distance between the second memory package and the memory controller.

9. The memory system of claim 1, further comprising:
   a heat sink configured to externally dissipate heat generated from the first memory package and the second memory package,
   wherein a distance between the first memory package and the heat sink is shorter than a distance between the second memory package and the heat sink.

10. The memory system of claim 9, wherein
    the first memory package and the heat sink are on a first surface of the substrate; and
    the second memory package is on a second surface of the substrate.

11. A memory system comprising:
    a first memory package including a plurality of first non-volatile memories (NVMs), the plurality of first NVMs having a first heat dissipation efficiency;

a second memory package including a plurality of second NVMs, the plurality of second NVMs having a second heat dissipation efficiency lower than the first heat dissipation efficiency;

a temperature sensor configured to detect a temperature of the second memory package; and a memory controller configured to,
- in response to the detected temperature reaching a first temperature threshold level,
  - control the plurality of first NVMs to increase a first temperature increase rate corresponding to the first memory package, and
  - control the plurality of second NVMs to decrease a second temperature increase rate corresponding to the second memory package, during a same time period, and
- in response to the detected temperature reaching a second temperature threshold level, lower a performance level of the first memory package and a performance level of the second memory package.

12. The memory system of claim 11, wherein the detected temperature acquired from the temperature sensor is a temperature for a memory package having a low heat dissipation efficiency, among the first memory package and the second memory package.

13. The memory system of claim 11, wherein the memory controller is configured to, in response to the detected temperature reaching the first temperature threshold level, increase a number of enabled NVMs among the plurality of first NVMs, and decrease a number of enabled NVMs among the plurality of second NVMs.

14. The memory system of claim 13, wherein
the first memory package is connected to the memory controller through a plurality of first chip enable pins;
the second memory package is connected to the memory controller through a plurality of second chip enable pins; and
the memory controller is configured to increase a number of pins receiving an enable signal among the plurality of first chip enable pins, and decrease a number of pins receiving the enable signal among the plurality of second chip enable pins.

15. The memory system of claim 11, wherein the memory controller is configured to, in response to the detected temperature reaching the first temperature threshold level, increase a number of commands provided to the first memory package, and decrease a number of commands provided to the second memory package.

16. The memory system of claim 11, further comprising:
a heat sink, wherein the first heat dissipation efficiency is based on a distance between the first memory package and the memory controller or a distance between the first memory package and the heat sink, and the second heat dissipation efficiency is based on a distance between the second memory package and the memory controller or a distance between the second memory package and the heat sink.

17. An operating method of a memory controller, the memory controller including a first memory package and a second memory package, each of the first memory package and the second memory package including a plurality of memory devices, and mounted on a substrate, the operating method comprising:
acquiring a temperature of the substrate from a temperature sensor;
increasing a performance level of the first memory package in response to the temperature of the substrate exceeding a first temperature threshold level;
decreasing a performance level of the second memory package in response to the temperature of the substrate exceeding the first temperature threshold level; and
decreasing the performance level of the first memory package and the second memory package in response to the temperature of the substrate exceeding a second temperature threshold level greater than the first temperature threshold level.

18. The operating method of claim 17, wherein
the increasing of the performance level of the first memory package includes increasing a number of commands provided to the first memory package; and
the decreasing of the performance level of the second memory package includes decreasing a number of commands provided to the second memory package.

19. The operating method of claim 17, wherein the first memory package has a higher heat dissipation efficiency than a heat dissipation efficiency of the second memory package.

20. The operating method of claim 17, wherein
the increasing of the performance level of the first memory package includes increasing a number of enabled memory devices among the plurality of memory devices included in the first memory package; and
the decreasing of the performance level of the second memory package includes decreasing a number of enabled memory devices among the plurality of memory devices included in the second memory package.

* * * * *